(12) United States Patent
Ice (10) Patent No.: US 7,473,107 B2
(45) Date of Patent: Jan. 6, 2009

(54) MOLDED LEAD FRAME CONNECTOR WITH MECHANICAL ATTACHMENT MEMBERS

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 42 days.

(21) Appl. No.: 11/381,112

(22) Filed: May 1, 2006

(65) Prior Publication Data

US 2006/0252313 A1    Nov. 9, 2006

Related U.S. Application Data

(60) Provisional application No. 60/676,426, filed on Apr. 29, 2005.

(51) Int. Cl.
*H01R 12/00* (2006.01)
(52) U.S. Cl. .......................................... 439/79; 439/736
(58) Field of Classification Search .................... 439/79, 439/736, 516
See application file for complete search history.

(56) References Cited

U.S. PATENT DOCUMENTS

| | | | |
|---|---|---|---|
| 4,471,158 A | 9/1984 | Roberts | |
| 4,689,023 A | 8/1987 | Strong et al. | |
| 5,219,305 A | 6/1993 | Kawaguchi et al. | |
| 5,286,221 A | 2/1994 | Fencl et al. | |
| 5,295,214 A | 3/1994 | Card et al. | |
| 5,340,334 A | 8/1994 | Nguyen | |
| 5,613,880 A | 3/1997 | Wang | |
| 5,632,630 A | 5/1997 | Card et al. | |
| 5,742,480 A | 4/1998 | Sawada et al. | |
| 6,068,523 A | 5/2000 | Takahashi | |
| 6,086,413 A | 7/2000 | Karasik et al. | |
| 6,368,158 B1 | 4/2002 | Kan | |
| 6,454,618 B1 | 9/2002 | Andoh et al. | |
| 6,488,534 B2 | 12/2002 | Soga et al. | |
| 6,527,571 B2 | 3/2003 | Muta et al. | |
| 6,530,786 B2 * | 3/2003 | Ishikawa | 439/79 |
| 6,617,518 B2 | 9/2003 | Ames et al. | |
| 6,652,294 B1 * | 11/2003 | Zhang | 439/83 |
| 6,688,897 B2 | 2/2004 | Korsunsky et al. | |
| 6,764,336 B2 | 7/2004 | Ma et al. | |
| 6,764,338 B2 | 7/2004 | Fang | |
| 6,796,852 B2 | 9/2004 | Okamoto | |
| 6,817,782 B2 | 11/2004 | Togami et al. | |
| 6,922,231 B1 | 7/2005 | Wang et al. | |
| 6,939,168 B2 * | 9/2005 | Oleynick et al. | 439/541.5 |

(Continued)

OTHER PUBLICATIONS

Office Action mailed Mar. 8, 2005 for U.S. Appl. No. 10/809,992.

(Continued)

*Primary Examiner*—Gary F. Paumen
(74) *Attorney, Agent, or Firm*—Workman Nydegger (57) ABSTRACT

Exemplary embodiments of the present invention illustrate lead frame connectors for connecting optical sub-assemblies to printed circuit boards in optical transceiver modules. The lead frame connectors include one or more stamped and bent conductors that are encased in a plurality of casings. The casings provide electrical insulation for the conductors in the lead frame connector as well as mechanical support for the finished component. The casing is also configured to extend between a top portion and a base portion of the transceiver module to direct forces applied to the transceiver module away from the optical sub-assembly and the printed circuit board.

20 Claims, 4 Drawing Sheets

U.S. PATENT DOCUMENTS

| | | |
|---|---|---|
| 6,966,800 B2 | 11/2005 | Mott |
| 6,976,854 B2 | 12/2005 | Stockhaus et al. |
| 7,097,468 B2 | 8/2006 | Ice |
| 7,144,259 B2 | 12/2006 | Ice et al. |
| 7,229,295 B2 | 6/2007 | Ice et al. |
| 2003/0026081 A1 | 2/2003 | Liu et al. |
| 2004/0009685 A1* | 1/2004 | Yamashita ............. 439/79 |
| 2005/0085109 A1* | 4/2005 | Tanaka et al. .......... 439/79 |
| 2005/0095883 A1* | 5/2005 | Osada ................... 439/79 |
| 2006/0019515 A1* | 1/2006 | Takagi .................. 439/79 |
| 2006/0068618 A1* | 3/2006 | Li et al. ................ 439/79 |
| 2006/0140554 A1 | 6/2006 | Oki |
| 2006/0249820 A1 | 11/2006 | Ice et al. |
| 2006/0263013 A1 | 11/2006 | Sone |
| 2006/0281346 A1* | 12/2006 | Pan ...................... 439/79 |

OTHER PUBLICATIONS

Office Action mailed Feb. 14, 2006 for U.S. Appl. No. 11/236,123.

Notice of Allowance mailed Feb. 12, 2007 for U.S. Appl. No. 11/468,752.

Office Action mailed Sep. 25, 2007 for U.S. Appl. No. 11/381,108.

\* cited by examiner

MOLDED LEAD FRAME CONNECTOR WITH MECHANICAL ATTACHMENT MEMBERS

CROSS-REFERENCE TO RELATED APPLICATIONS

This application claims the benefit of the U.S. Provisional Patent Application No. 60/676,426, filed Apr. 29, 2005, and entitled "Molded Lead Frame Connector with Mechanical Attachment Members," which is incorporated herein by reference in its entirety.

BACKGROUND OF THE INVENTION

1. The Field of the Invention

The present invention relates generally to optical transceiver modules. More specifically, the present invention relates to a lead frame connector used to connect an optical sub-assembly to an optical transceiver module's printed circuit board with one or more mechanical attachment members that limit the affects of shock, vibration, and side loads.

2. Background and Relevant Art

The basic optical components of conventional transceivers include two optical sub-assemblies (OSAs); a transmitter optical sub-assembly (TOSA) and a receiver optical sub-assembly (ROSA). The TOSA receives electrical signals from a host device via circuitry of the transceiver module and generates a corresponding optical signal that is then transmitted to a remote node in an optical network. Conversely, the ROSA receives an incoming optical signal and outputs a corresponding electrical signal that can then be used or processed by the host device. Additionally, most transceivers include a rigid printed circuit board (PCB) containing, among other things, control circuitry for the TOSA and ROSA.

The connections between the optical sub-assemblies and the PCB in the transceiver module have various electrical and mechanical requirements. One of the most common electrical connection components used in conventional optical transceiver modules is a flexible printed circuit board, or "flex circuit," that connects the rigid printed circuit board to leads associated with the TOSA or ROSA. Flex circuits have several advantages, including good electrical performance and radio frequency response. Advantageously, the flex circuits also have the ability to take up tolerances in the modules and to withstand stresses that arise during manufacture and operation of the modules.

While flex circuits have been widely used in recent years in optical transceiver modules, flex circuits represent a significant portion of the costs and labor required to manufacture transceiver modules. As the price of transceiver modules drops, the costs associated with flex circuits continue to represent an increasing proportion of the overall costs of transceiver modules. Due to the nature of flex circuits, the costs of producing flex circuits are generally higher than the cost of a PCB that performs the same functions.

Additionally, flex circuits by design do not provide a rigid mechanical attachment between the OSA and the PCB. Such rigid attachment between the OSA and the PCB can be advantageous in designs where mechanical stress applied to an optical connector of the OSA is transferred to the PCB rather than to the transceiver module housing.

Other approaches to connecting optical sub-assemblies to printed circuit boards have been introduced in recent years. For example, the leads protruding from TOSAs and ROSAs can be bent into a configuration that enables the leads to be directly soldered or otherwise connected to the printed circuit board. This technique is often less expensive than the use of flex circuits, but can lead to unfavorable radio frequency (RF) response due to the inability to carefully control impedances. In addition, bending the leads of TOSAs and ROSAs introduces reliability risks due to the likelihood of damaging glass seals or other fragile portions of the header assemblies in TOSAs and ROSAs that enclose the lasers and photodetectors, respectively.

Because of the possibility of damaging the TOSAs and ROSAs and poor electrical performance, bending the leads of the TOSAs and ROSAs to enable them to be directly connected to the printed circuit board is not suitable for many transceiver modules. This approach is particularly unsuitable for relatively high-speed transceiver modules, in which the RF response of the conductors is more important.

BRIEF SUMMARY OF THE EMBODIMENTS

Embodiments of the present invention relate to lead frame connectors that are used to electrically and mechanically connect optical sub-assemblies (OSAs) to printed circuit boards in optical transceiver modules. The lead frame connector fixably mounts within the transceiver module and prevents movement of an OSA relative to the module and the printed circuit board under shock and load. Mechanical attachment members of the lead frame connector mechanical attach the OSA to the printed circuit board and limit movement of the printed circuit board in two or more directions. The use of such lead frame connectors eliminates the need for flexible printed circuit boards that have been used in conventional transceiver modules.

According to one embodiment, the lead frame connector connects the leads of an optical sub-assembly with the pads of a printed circuit board. The lead frame connector can include one or more conductors encased within an electrically insulating housing. Extending from the housing, and optionally being conductive, are two or more mechanical attachment members. These members can optionally mount to the printed circuit board by way of one or more though holes and generally limit movement of the optical sub-assembly relative to the printed circuit board. To also aid with limiting movement of the optical sub-assembly and the printed circuit board, the housing can extend from a base portion to a top portion of the module containing the optical sub-assembly and the printed circuit board.

An alternate embodiment of the present invention includes one or more conductors encased within a two-piece or two casing housing. The conductors and the two casings can be coplanar during the molding process. This makes the creation of the tooling needed to produce the lead frame connectors much easier than prior designs. The casings provide electrical insulation for the conductors in the lead frame connector as well as mechanical support for the finished component. Extensions formed in one of the casings supports the lead frame connector against a based of a transceiver module, while a top of the same casing is configured to abut a top portion of the transceiver module. By so doing, the lead frame connector fixably mounts within the transceiver module and prevents movement of the OSA relative to the module and the printed circuit board under shock and load. Optionally, two mechanical attachment members, optionally functioning as conductors, extend from the sides of the casing and mount to the printed circuit board. This again provides additional mechanical attachment of the OSA to the printed circuit board and limits movement of the OSA relative to the printed circuit board under applied loads and shock.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE EMBODIMENTS

The present invention relates to lead frame connectors that are used to electrically and mechanically connect an optical sub-assembly, such as a transmitter optical sub-assembly (TOSA) or receiver optical sub-assembly (ROSA) to a printed circuit board in optical transceiver modules. The lead frame connector can include a plurality of conductors disposed within a two-piece housing. Molding of the casing or housing about the conductors can occur as the conductors lie in a single plane, thus making it easier to fabricate the lead frame connectors. One piece of the housing can mount between a top portion and a base portion of the transceiver module, while two mechanical attachment members, such as arms or wings, can extend and mechanically attach the lead frame connector to the printed circuit board. This connection can limits movement and the affects of shock vibration and side loads upon the optical sub-assembly and the printed circuit board. In addition to including the mechanical attachment members to increase the mechanical attachment between the lead frame connector and the printed circuit board, the housing can include extensions that engage with a portion of a transceiver module to limit movement of the lead frame connector. For instance, a portion of the housing can extend from a top portion to a base portion of the transceiver module and limit movement of the lead frame connector, and so the printed circuit board and the optical sub-assembly under the influence of shock, vibration, and side loads.

The lead frame connectors of the present invention provide several advantages compared to the use of flex circuits or other conventional techniques. Compared to flex circuits, the components of the lead frame connector are significantly less expensive. In addition, the process of manufacturing a transceiver module using the presently described lead frame connectors can require less labor and associated costs. Compared to simply bending the leads of the optical sub-assemblies to permit direct connection to a printed circuit board, the lead frame connector has significantly better electrical performance and signal response.

In addition to the above, the use of a housing that extends from a top portion to a bottom portion of the transceiver module reduces the occurrence of optical sub-assembly misalignment that can occur when forming the transceiver module. Since the housing extends from the top portion to the bottom portion, the housing prevents unwanted contact between the top portion or the bottom portion and the optical sub-assembly that can change the alignment of the optical sub-assembly relative to the transceiver module's end. Misalignment can cause unwanted damage to the optical sub-assembly during optical connector insertion and removal.

Figure 1:
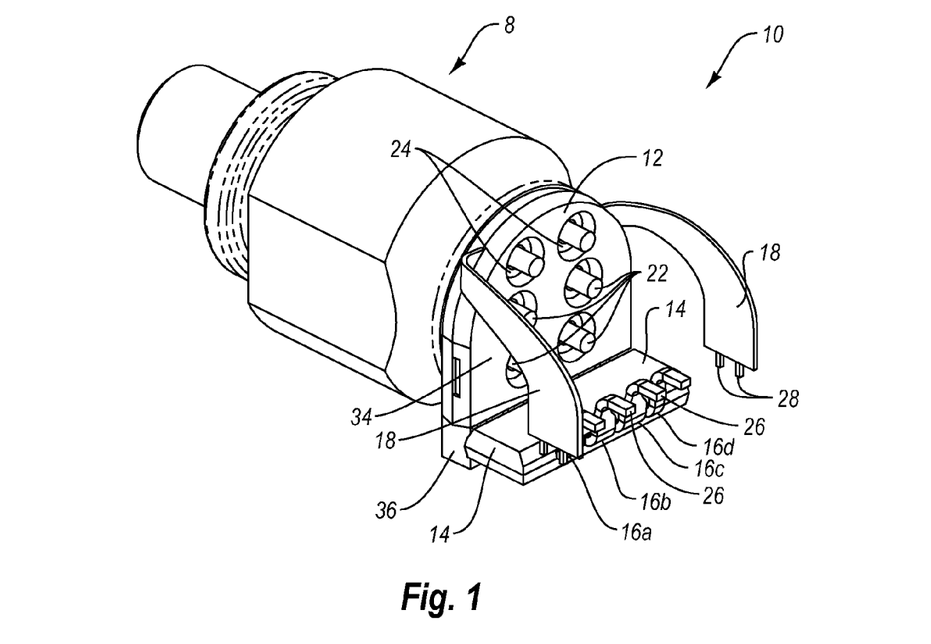
FIG. 1 illustrates a perspective view of a lead frame connector mounted to an optical sub-assembly according to one exemplary embodiment the present invention.

FIG. 1 illustrates one exemplary configuration of a lead frame connector 10 mounted to an optical sub-assembly 8, such as but not limited to either a TOSA or a ROSA. As shown, lead frame connector 10 includes a first casing 12 and a second casing 14 that each can support a portion of one or more conductors 16a-16d and 18. Collectively, the first casing 12 and the second casing 14 form the housing of the lead frame connector 10. The first casing 12 can include a body 34 with two members 36 extending from the body 34; only one member 36 is illustrated in FIG. 1. The members 36 can provide support to the lead frame connector 10 when it is inserted within a housing of a transceiver module 60 (FIG. 7A), as will be discussed in more detail hereinafter.

As illustrated, a first end of each conductor 16a-16d and 18 is contained within the first casing 12; the first end of each conductor 16a-16d having a contact 22 and the first end of each conductor 18 having a contact 24. Each contact 22 and 24 can cooperate with the leads of the optical sub-assembly 8. As shown in FIG. 1, the electrical contacts 22 and 24 are fixed in position relative to one another by the first casing 12, however, it can be understood that the electrical contacts 22 and 24 can be held in a fixed position by first casing 12 without being entirely contained therein. Optionally, these contacts 22 and 24 are separate from the conductors 16a-16d and 18, but are being electrically connected to the conductors 16a-16d and 18, i.e., signals can pass from one or more of the conductors 16a-16d and 18 to one or more of the contacts 22 and 24.

Figure 5:
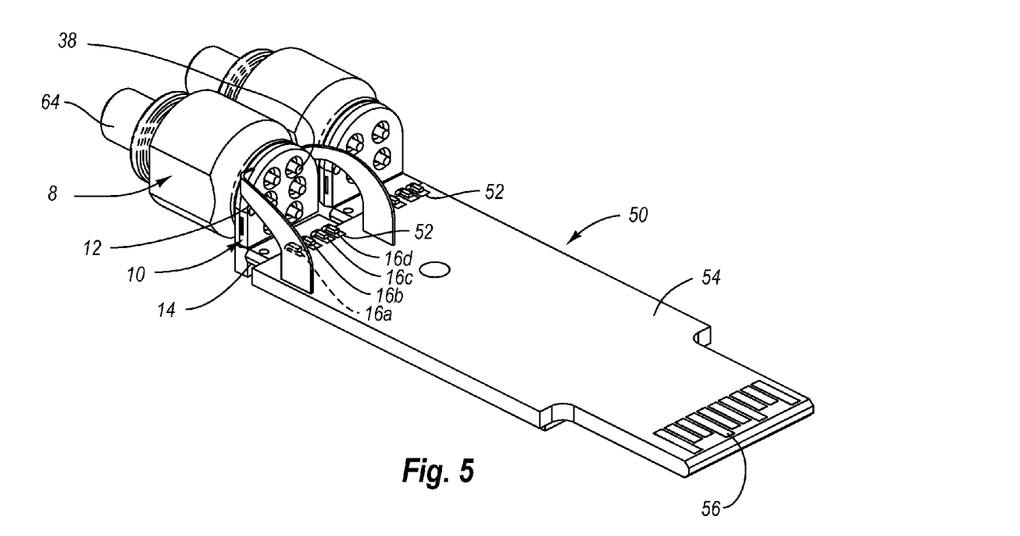
FIG. 5 illustrates a perspective view of an optical sub-assembly mounted to a printed circuit board by way of the lead frame connector according to the exemplary embodiment of the present invention.
Figure 6:
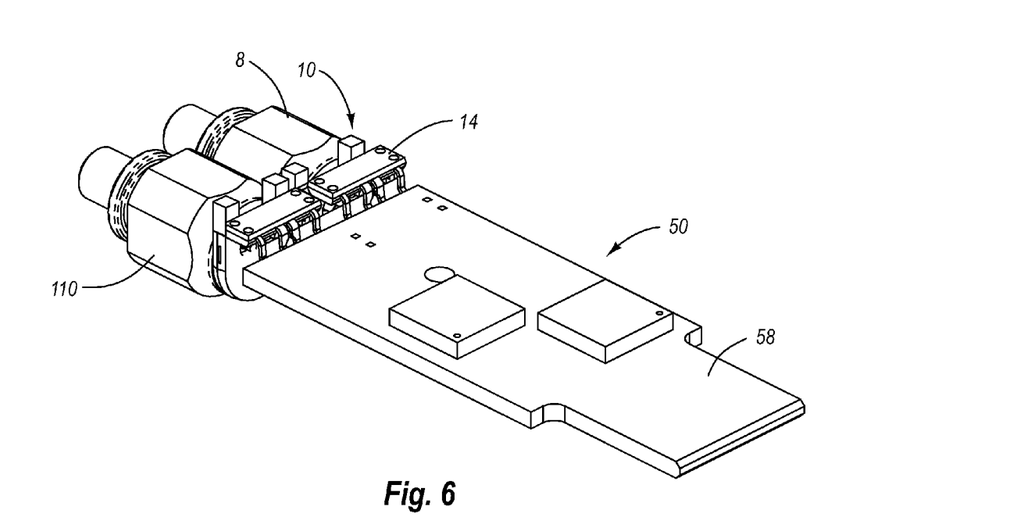
FIG. 6 illustrates another perspective view of an optical sub-assembly mounted to a printed circuit board by way of the lead frame connector according to the exemplary embodiment of the present invention.

A second end of each conductor 16a-16d and 18 can include a PCB contact 26 and 28, respectively, which can be used to attach and make electrical contact with a printed circuit board, such as printed circuit board 50 (FIG. 5). Stated another way, and shown in FIG. 1, each second end can act or function as a contact or point that is sized and configured to be connected to, for example, the pads of the printed circuit board 50 (FIG. 5). As shown, the second end of the conductors 16a-16d have a generally bent configuration to facilitate efficient attachment to the pads mounted to an upper surface of the printed circuit board 50 (FIG. 5). Similarly, the second end of the conductors 18 can include PCB contacts 28 that can optionally pass through a portion of the printed circuit board 50 (FIG. 5). The second end of each conductor 18 is configured to provide a surface area larger than that presented by the PCB contact 26 and so provide sufficient contact area to increase the area of attachment between the lead frame connector 10 and the printed circuit board 50 (FIG. 5). It will be a understood however, that other configurations of the second end are possible.

One advantage of this configuration of the lead frame connector 10 is that the first casing 12 and the second casing 14 can be coplanar during the manufacturing process. The two casings 12, 14 and the conductors 16a-16d and 18 can be generally aligned in parallel planes, optionally co-planar, during the manufacturing process, and the second casing 14 orientated relative to the first casing 12 during the assembly process, such as before or after attachment of the lead frame connector 10 to the optical sub-assembly 8. In either case, the conductors 16a-16d can be manipulated or bent to the desired configuration at a location between the first casing 12 and the second casing 14 and/or at a location adjacent to the second casing 14, as part of the assembly process. Similarly, the conductors 18 can be bent at a location intermediate of the first end and the second end as part of the assembly process. Of course, depending on the position of the optical sub-assemblies and the printed circuit board in any particular optical transceiver module, the conductors 16a-16d and 18 can be bent in any necessary orientation.

Although the illustrated lead frame connector 10 includes six conductors and six electrical contacts for connecting to the optical sub-assembly 8, it can be appreciated that other lead frame connectors can include more or less conductors and electrical contacts. For instance, when an optical sub-assembly includes four leads, the lead frame connector can include four or more electrical contacts and four or more conductors. Similarly, when an optical sub-assembly includes three six leads, the lead frame connector can include three or more electrical contacts and three or more conductors.

Although reference is made herein to the conductors 16a-16d and 18 being electrically connected to the leads of an optical sub-assembly, it can be understood that the conductors 18 can be included in the lead frame connector 10 solely to increase the mechanical attachment of the lead frame connector 10 to the printed circuit board 50 (FIG. 5), i.e., the conductors 18 may not be electrically connected to the optical sub-assembly and the printed circuit board 50 (FIG. 5). Therefore, in some embodiments the conductors 18 only function as mechanical attachment members that aid with attaching the lead frame connector 10 (FIG. 1) to the printed circuit board 50 (FIG. 5) and do not carry any electrical signals. Therefore, more generally, the lead frame connector of the present invention can include one or more conductors, such as conductors 16a-16d, and one or more mechanical attachment members, such as, but not limited to, the conductors 18 in the illustrated configuration.

In exemplary embodiments, the first and second casings 12, 14 of the lead frame connector 10 can be fabricated using an injection molding process, a transfer molding process, or other molding processes known to those of skill in the art. Therefore, the casings 12, 14 can generally be made from a polymer including, but not limited to, a thermoplastic and thermoset material, a synthetic material, or other material capable of functioning as a dielectric or insulator. With respect to use of a polymer, any polymer that has sufficient mechanical strength to withstand the bending process can be used. For instance, one type of polymer can be, but not limited to, a Liquid Crystal Polymer (LCP) and a Polyetherimide (PEI). One example of an LCP is Vectra® manufactured by Ticona Engineering Polymers, while one example of a PEI is Ultem® PEI resin from General Electric (GE) Plastics.

In addition to selecting materials based upon its characteristics as a dielectric or insulator, the material used to form the housing can be selected based upon the materials flammability rating or governmental regulations, such as but not limited to those that eliminate the use of halogenic fire retardants and heavy metals. In one configuration, therefore, the material used for the housing can be selected to comply with an Underwriter's Laboratories (UL) 94V0 flammability rating. In yet other embodiments, the material can be selected to comply with the Reduction of Hazardous Substances (ROHS) Directive 2002/95/EC of the European Union, Turning to the conductors 16a-16d and 18, those skilled in the art will realize that a wide variety of metals and/or metal alloys can be used to form the conductors 16a-16d and 18, including but not limited to, a copper-iron alloy (C194-Spring Hard). In one embodiment, the conductors 16a-16d and 18 can be a metal or metal allow and plated with successive layers of nickel, palladium, and/or gold. Using this plating technique, excellent solderability can be achieved with lead free solder, while eliminating tin whisker problems associated with pure tin plating systems. It is desirable to use a lead free solder to comply with the ROHS directive mentioned herein. It will, however, be understood that other plating materials can be used. Similarly, other configurations of the present invention can use conductors that are not plated.

One of the advantages of the exemplary embodiments of the lead frame connectors of the present invention is that they can be manufactured at a much lower cost than conventional flex circuits that have been used in optical transceiver modules. Additional details of the lead frame connector 10 of the present invention will now be provided with the following discussion of the processes and methods of manufacturing or fabricating the lead frame connector 10 and mounting the lead frame connector 10 to an optical sub-assembly and/or a printed circuit board.

According to one embodiment, one exemplary method of manufacturing the lead frame connector 10 can be performed using a reel-to-reel insert injection molding process. Reel-to-reel insert injection molding processes are known generally in the art, but have not previously been applied to the manufacture of connectors that can be used to connect optical sub-assemblies to printed circuit boards of optical transceiver modules. Reel to reel processing is a low cost process typically used for high volume applications. It will be understood that smaller volumes can be made in individual strips containing one or more lead frame connectors that are then loaded into a molding machine. The choice of a particular manufacturing process can be driven by the optimum tradeoff between tooling cost, part cost, and volume without significantly changing the design of the part.

This exemplary process of manufacturing lead frame connector 10 can include stamping the conductor structure and configuration in a ribbon of conductive material, such as copper, steel, or other conductive material. Although stamping is one manner of forming the lead frame conductors, such as when a high volume of conductors are need, other techniques can be used to fabricate the lead frame conductors, such as but not limited to, a photochemical technique.

Figure 2:
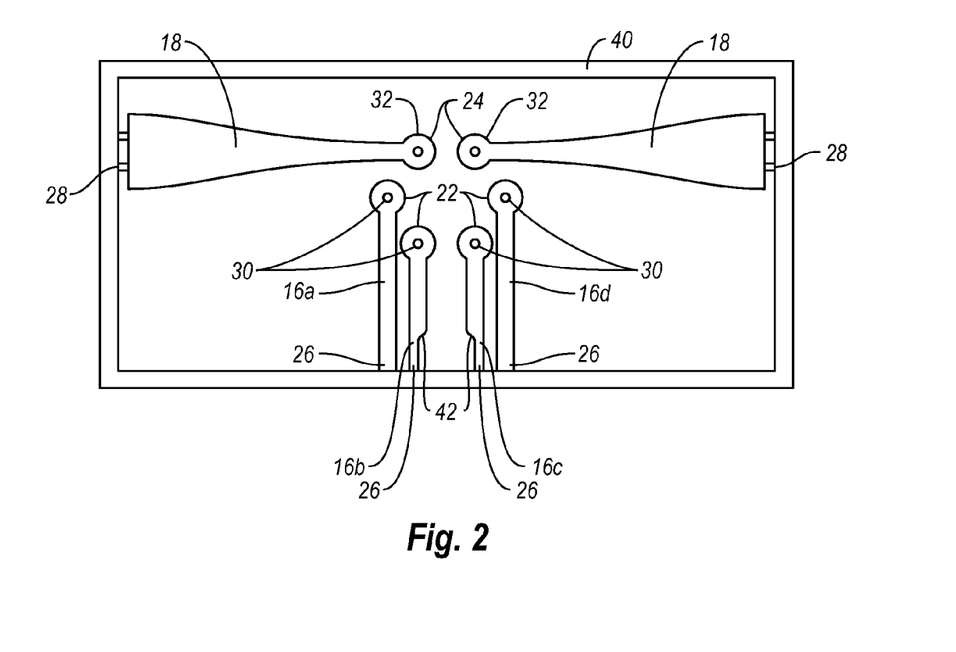
FIG. 2 illustrates a top view of the conductors for the lead frame connector of FIG. 1 mounted in a support frame.

An exemplary configuration of a stamped structure is illustrated in FIG. 2. Although only one structure is depicted in FIG. 2, it can be understood that one or more structures can be stamped on a reel or piece of conductive material. Each conductor 16a-16d and 18 can connect to a portion of a ribbon 40 that supports the conductors 16a-16d and 18 during injection molding. The ribbon 40 also positions the conductors 16a-16d and 18 so that each contact will be electrically isolated one from another after singulation of the lead frame connector 10 (FIG. 1) following molding of the casing 12 (FIG. 1) and the casing 14 (FIG. 1).

In this particular configuration, each conductor 16a-16d and 18 can have a different configuration based upon the signal carried by the conductor 16a-16d and 18 and/or the manner of attachment to the printed circuit board 50 (FIG. 5) to achieve the desired mechanical attachment. As shown, each conductor 16a and 16d can include the contact 22 at its first end and the PCB contact 26 at its second end. Both conductors 16a and 16d can transmit low-frequency signals, with one of conductors 16a and 16d optionally carrying the laser biasing DC current. As illustrated, the conductors 16a-16d have a generally uniform cross-section from the PCB contact 26 toward the contact 22. Other non-uniform cross-sections, however, are possible.

Similar to the conductors 16a and 16d, each conductor 16b and 16c can include the contact 22 at its first end and PCB contact 26 at its second end. Unlike the conductors 16a and 16d, the conductors 16b and 16c include a transition portion 42 intermediate the first end and the second end of each conductor 16b and 16c. The location and degree of the transition portion 42 can be varied to aid with matching the impedance presented by the particular optical sub-assembly to which the lead frame connector 10 (FIG. 1) mounts. In this manner, the conductors 16a-16d and 18 can be properly terminated and signal reflection at the interface between the lead frame connector 10 (FIG. 1) and the optical sub-assembly reduced or eliminated. For instance, the particular configuration can be selected so that the conductors 16b and 16c provide the desired inductance, capacitance, and/or resistance for transmission of the high frequency signals propagating along the conductors 16b and 16c. Various configurations of the conductors 16b and 16c are possible.

Turning to the conductors 18, each conductor 18 can include the contact 24 at its first end and the PCB contacts 28 at its second end. The conductors 18 can transmit low-frequency signals from the printed circuit board 50 (FIG. 5) to the optical sub-assembly. As illustrated, the conductors 18 can have a cross-section at the PCB contacts 28 that is greater than the cross-section at the contact 24. This increased cross-section increases the available surface area at the second end for mounting to the printed circuit board 50 (FIG. 5). Optionally, the PCB contacts 28 can pass through a portion of the printed circuit board 50 (FIG. 5) to provide additional mechanical attachment over merely attaching the PCB contacts 28 to pads on the surface of the printed circuit board 50 (FIG. 5).

The particular configuration of the conductors 16a-16d and 18, and more generally the lead frame connector 10 (FIG. 1), are selected to yield desirable electrical performance and signal responses. These results can be achieved because of the ability to control impedances associated with the lead frame connector 10 (FIG. 1) by varying the dimensions and materials forming the conductors 16a-16d and 18. Since the electrical performance of the lead frame connector 10 (FIG. 1) is particularly important for relatively high frequency transceiver modules, such as those that operate at 1, 2, 4, or as much as 10 Gbit/s or higher, the width and shape of the conductors 16a-16d and 18 of the lead frame connector 10 (FIG. 1), and the gaps between conductors 16a-16d and optionally 18 can be carefully controlled to obtain the desired impedances. For instance, the lead frame connector 10 (FIG. 1) for use with a TOSA can be designed to utilize 25 Ohm single end impedance or 50 Ohm differential impedance. Alternately, a lead frame connector for use with a ROSA can be designed to utilize a 50 Ohm single end impedance, or a 100 Ohm differential impedance. Differential signals that propagate along the two adjacent conductors, such as the high speed conductors 16b and 16c, are 180° out of phase. Since the signals are transmitted along proximate paths, the phase shift helps to mitigate or even eliminate the potential cross talk and interference between the signals.

The impedances can be controlled by adjusting the shape, position, and dimensions of the conductors 16a-16d and 18 in the lead frame connector 10 (FIG. 1), based on the electrical and signal conditions that are to be experienced in any particular application. The particular configuration of the conductors 16a-16d and 18 can be selected following computer simulations of various designs. These computer simulations can be used to create a lead frame connector design that generates the desired and acceptable signal responses, i.e., provides the desired impedances.

Various factors can be taken into account during the computer simulations. These factors can sometimes be broken down into factors that mostly affect the physical design and factors that mostly affect the electrical design. Physical design factors can include the layout of the lead frame connector, how the lead frame connector 10 (FIG. 1) connects to both the optical sub-assembly and the printed circuit board 50 (FIG. 5), how well the end product stands up to normal handling, and dielectric constant of the material forming the housing. The electrical design factors can include selecting material for the leads, determining the exact dimensions of the leads based on a desired frequency range in which the finished assembly will operate, determining the size and spacing of the circuits on the PCB, etc to obtain the desired impedances. It is also possible that the material used to mold the lead frame connector 10 (FIG. 1) can be selected to have a dielectric constant selected to aid with obtain the desired impedances.

In accordance with one embodiment, the physical and electrical design factors can be used to design the conductors 16a-16d and 18 of the lead frame connector 10 (FIG. 1) and achieve the desired impedance characteristics. In one stage, an initial lead frame connector design can be configured. This stage can be performed manually, by computer-aided design, or by other suitable method, and serves as a starting point for the lead frame connector design. Often, the initial lead frame connector design is based on what is most readily manufacturable.

In a next stage, the structure of the initial lead frame connector design can be simulated, or modeled, in a computing environment, such as an environment using one or more computer executable applications, such as commercial or private software applications. In one embodiment, the structural details of the initial connector design can be input into a computing device, such as a desktop computer, using a three dimensional ("3-D") structural modeling application, such as SOLIDWORKS, thereby creating a computerized model of the initial connector design. In this way, the various components of the connector, including the conductors, the first and second casings, etc., can be separately defined in the computing environment.

In a next stage, desired characteristics can be assigned to the modeled initial lead frame connector design. In one embodiment, this can be accomplished by importing the computerized model from the 3-D modeling application, such as SOLIDWORKS, to a simulation application, such as HFSS, an acronym for "high frequency structure simulator," which is a 3-D EM field solver product produced by Ansoft Corporation. Although this is one simulation application, one skilled in the art will understand that various other applications can be used to simulate the proposed configuration.

Once the initial connector design is imported into to the simulation application, the various components included in the lead frame connector can be assigned electrical characteristics. This can include assigning dielectric values to the insulating portions of the lead frame connector, such as the first and second casings, and conductivity values to the conductors, according to material composition. This stage can also include the definition of the various ports by which electrical signals enter and exit the lead frame connector, such as the first and second ends of the conductors. In one embodiment, it is appreciated that the stages of structural simulation of the lead frame connector simulation and characteristic assignment of the lead frame connector components can be performed as a single stage in connection with a single software application or other suitable computer executable application. Also, the characteristic assignment stage above can further include defining boundary conditions at the input and output ports of the lead frame connector.

In a next stage, a set of parameters for a simulation can be defined, and a simulation performed to determine whether the desired parameters are met within acceptable, predefined ranges. In one embodiment, for instance, the reflection, or return loss, of an electrical signal can be measured for the conductors of a lead frame connector having specified thickness and spacing, as initially designed in the above stages. Thus, an acceptable range for the predefined parameter of return loss versus conductor spacing, thickness, etc., can be defined. The simulation can then be performed, simulating the passage of signal having a predetermined frequency, typically a high frequency signal in the Gigahertz range, through the initial connector design configured as just described. The simulation software can then produce the results, which can be viewed in a number of acceptable ways, including graphs, charts, and diagrams.

Should the results of the simulation fall within the range of the parameters, no further modeling need be performed with respect to the defined parameter. Should the simulation results not be satisfactory, however, the initial lead frame connector design can be modified and the simulation re-run. Modification of the initial lead frame connector design can involve one or more of the stages described above. In the case where the computer modeling and simulation stages are performed by a single application, for instance, redesign of needed portions of the lead frame connector design can be performed without having to import the redesign from another application. Iterations of the method are possible until acceptable ranges are encountered for all specified portions of the lead frame connector transmission paths with regard to the targeted parameter, at which point no further design changes are required. In light of these results, it should also be considered whether the final lead frame connector design conforms to manufacturability standards. If not, further design changes can be made to enable the lead frame connector to be produced as part of a manufacturing process.

Using the processes described above, it can be determined that one or more of the conductors 16a-16d and 18 in the lead frame connector 10 (FIG. 1) can have a thickness of approximately 0.2 mm, a width of approximately 0.5 mm, and a separation distance of approximately 0.3 mm. Depending on the materials used for the leads and the casing, and further depending on the specific frequency that the lead frame connector/optical sub-assembly combination is designed for, different dimensions are also possible and fall within the scope of the embodiments discussed herein. The dimensions cited above are provided strictly as an example of one possible set of dimensions for the leads.

Figure 3:
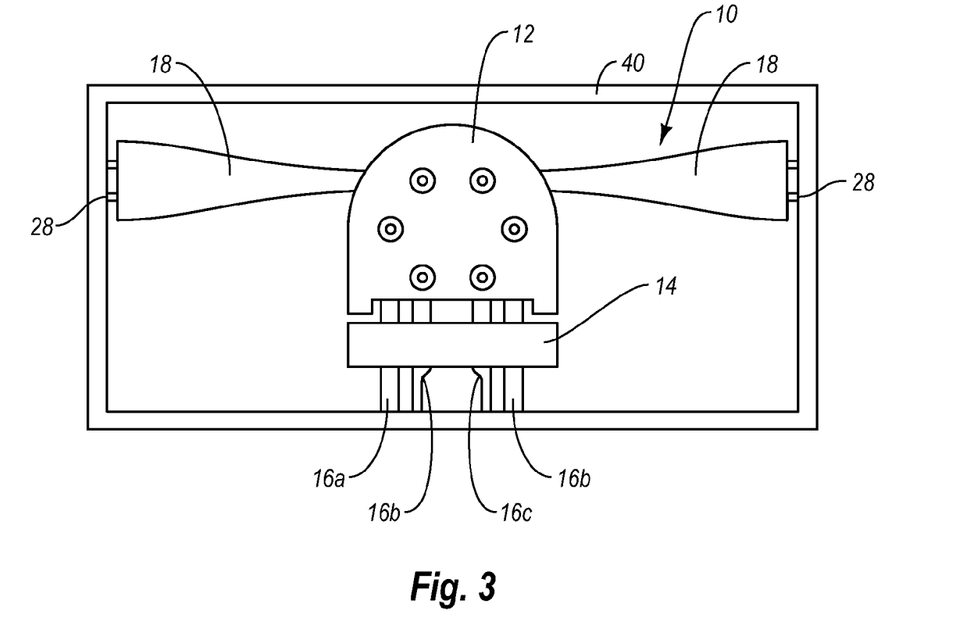
FIG. 3 illustrates a top view of lead frame connector of FIG. 1 mounted in an overmolded casing.

With continued reference to FIG. 2, and the method of manufacturing the lead frame connector 10 (FIG. 1), once stamped the ribbon of stamped conductors can be spooled from one reel to another as the insert injection molding process is performed to form the housing, i.e., the first casing 12 and the second casing 14. Illustrated in FIG. 3 is a portion of the ribbon 40 having the first casing 12 and the second casing 14 formed about the conductors 16a-16d and 18.

Figure 4:
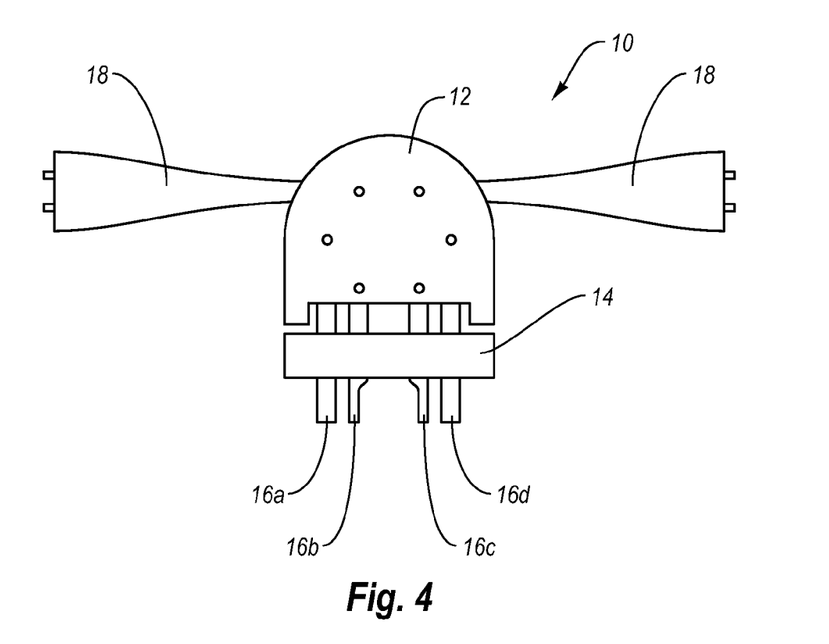
FIG. 4 illustrates a top view of the lead frame connector of FIG. 1 separated from the support frame of FIG. 3.

After the first casing 12 and the second casing 14 are formed, the combination of the lead frame conductor 10 mounted to the ribbon 40 can pass through a singulation die that dices the ribbon 40 into individual lead frame connectors 10, one of which is illustrated in FIG. 4. For instance, the dicing process can separate the conductors 16a-16d and 18 from the ribbon 40. Once the lead frame connector 10 has been separated from other lead frame connectors, it is possible to mount the lead frame connector 10 to the optical sub-assembly 8 (FIG. 1) and subsequently mount the combination of the lead frame connector 10 and the optical sub-assembly 8 to the printed circuit board 50, as illustrated in FIG. 5. This aids with the manufacture of the transceiver module containing the lead frame connector 10, the optical sub-assembly 8 to the printed circuit board 50.

Figure 7A:
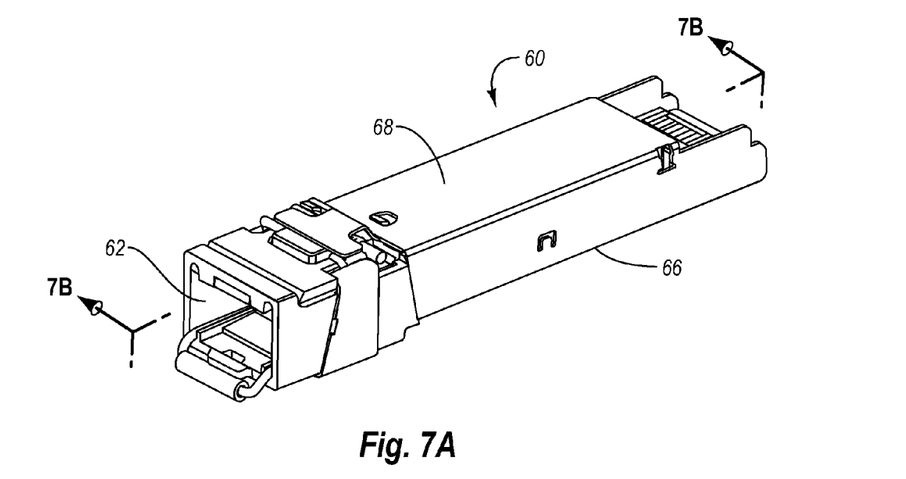
FIG. 7A illustrates a perspective view of a transceiver module having the lead frame connector of the present invention.

With reference to FIG. 5, during the manufacture of a transceiver module 60 (FIG. 7A), each optical sub-assembly 8 is optically aligned with a port 62 (FIG. 7A) that receives the optical connector (not shown). It is preferable that a nose 64 of the optical sub-assembly 8 be generally parallel and straight with the port 62 (FIG. 7A) so that the optical connector can engage with the optical sub-assembly 8 and forces applied by the optical connector are not transferred to the other components of the transceiver module 60 (FIG. 7A), i.e., the lead frame connector 10 and the printed circuit board 50. The present invention decreases the complexity of optically aligning the optical sub-assembly 8 by using the location of the optical sub-assembly 8 within the transceiver module 60 (FIG. 7A) as a fixed position and varying the position of the printed circuit board 50 relative to the transceiver a module 60 (FIG. 7A). More specifically, as part of the manufacturing process, the position of the lead frame connector 10 relative to the optical sub-assembly 8 can be normalized and then subsequently the position of the printed circuit board 50 relative to the combined lead frame connector 10 and optical sub-assembly 8 can be normalized. This aligns the optical sub-assembly 8, the lead frame connector 10, and the printed circuit board 50. By so doing, the process of optically aligning the optical sub-assembly 8 during manufacture can be performed easily and efficiently.

One way to achieve the desired alignment is by using one or more jigs. Using one jig the optical sub-assembly 8 can receive the lead frame connector 10. With reference to FIGS. 2 and 5, since the position of one or more leads 38 extending from the optical sub-assembly 8 can vary, holes 30 and 32 in the conductors 16a-16d and 18 of the lead frame connector 10 can be used to compensate for changes in the tolerances between the leads 38. During the manufacturing process the leads 38 can pass through holes 30 and 32, as shown in FIG. 2, associated with the contacts 22 and 26 of the lead frame connector 10 and the leads 38 soldered to the conductors 16a-16d and 18. Mounting the leads 38 to the contacts 22 and 26, such as by passing the leads 38 through the holes 30 and 32 in the contacts 22 and 26, can result in substantial self-alignment of lead frame connector 10 with the optical sub-assembly 8. Once the soldering has been performed, the combined optical sub-assembly 8 and the lead frame connector 10 becomes a single device that can then be mounted to the printed circuit board 50.

Either before or after mounting the optical sub-assembly 8 to the lead frame connector 10, the manufacturing process can include bending portions of the connectors 16a-16d and 18 to achieve the configuration illustrated in FIG. 5. For instance, the ends of the conductors 16a-16d and 18 can be bent to any desired angle to create the PCB contacts 26 and 28 used to engage the pads on the printed circuit board 50. As shown in FIG. 5, the second ends of the conductors 16a-16d can be given two generally 90° bends in opposite directions to form the PCB contacts 26, while the conductors 18 can be bent to engage with the printed circuit board 50. Depending on the specific application, other angles are also possible. In alternate embodiments, the conductors 16a-16d and 18 can be bent prior to molding process and/or attachment to the optical sub-assembly.

In addition to bending the second ends, and optionally before or after mounting the optical sub-assembly 8 to the lead frame connector 10, the casing 14 can be orientated relative to casing 12 by bending the conductors 16a-16d at a location intermediate of the casing 12 and the casing 14. By so doing, the casing 14 can be, in one configuration, orientated generally perpendicular to the casing 12. The degree of bending of the conductors 16a-16d can vary based upon the position of the optical sub-assembly and the printed circuit board 50 within the transceiver module.

With the conductors 16a-16d and 18 bent into the desired orientation, the combination of the lead frame connector 10 and the optical sub-assembly 8 can be mounted within another jig during attachment of the PCB contacts 26 and 28 to one or more pads 52 of the printed circuit board 50. The conductors 16a-16d and 18 can mount to a top portion 54 containing the pads 52. The physical connection between conductors 16a-16d and 18 can be made by hand soldering, by reflow of a solder paste formed on the printed circuit board 50, by a hot bar process, or by any other suitable technique. Another option can be to use a fixture that facilitates the process of placing the lead frame connector 10 in contact with printed circuit board 50 and soldering it thereto.

Due to the sensitivity of certain high speed signals, such as those associated with 10G transceiver modules, the pads 52 can be disposed on the same side of the printed circuit board 50 as the edge connector fingers 56, i.e., the top portion 54 in the illustrated configuration. This results in the signals being carried through the circuitry of the printed circuit board 50 on the top portion 54 and limits possible degradation and reflection of the signals by including a path that requires the signal to traverse to a bottom portion 58 of the printed circuit board 50.

Figure 7B:
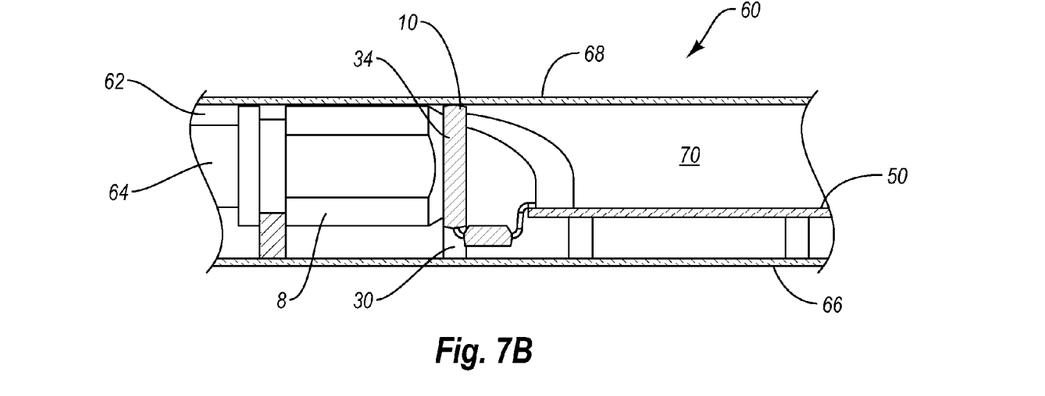
FIG. 7B illustrates a cross-sectional side view of the transceiver module of FIG. 7A.

With the optical sub-assembly 8, the lead frame connector 10, and the printed circuit board 50 mounted together, the combined structure can be disposed within an interior of a transceiver module 60, as shown in FIGS. 7A and 7B. As illustrated in FIG. 7A, the transceiver module 60 includes a base portion 66 and a top portion 68. Disposed between the base portion 66 and the top portion 68 is a cavity 70, as illustrated in FIG. 7B. Disposed between the base portion 66 and the top portion 68 within the cavity 70 are the optical sub-assembly 8, the lead frame connector 10, and the printed circuit board 50. In contrast to other transceiver modules, the lead frame connector 10 extends from the base portion 66 to the top portion 68 as the body 34 contacts the top portion 68 and the members 36 contact the base portion 66. This configuration fixes the orientation of the optical sub-assembly 8 and aids in preventing movement of the optical sub-assembly 8 from side loads, shock, and vibration. In addition, since a portion of the lead frame connector 10 extends the entire distance between the base portion 66 and the top portion 68, any forces exerted upon the top portion 68 during manufacture are transmitted to the base portion 66 and not to the optical sub-assembly 8, as typically occurs during current manufacturing techniques when a heat sink is to be located adjacent the optical sub-assembly 8. This limits the possibility of the optical sub-assembly 8 being moved out of alignment and so becoming damaged during insertion and removal of an optical connector (not shown) within the ports (not shown) of the transceiver module 60.

The exemplary embodiments of the methods and devices of the present invention have many of the advantages over prior systems. Since the casings can be coplanar during manufacture, it is much easier to manufacture the tooling needed to produce the injection molded part. Additionally, the punch out step can be eliminated, thus saving additional manufacturing costs. Finally, the lead frame connector 10 can be held at their ends, thus making it easier to grip the connectors during the manufacturing process. No external tabs, projections, or stubs are required, nor do such tabs, projections or stubs need to be removed as part of the assembly process. Additionally, the flattened configuration provides unobstructed access to the solder joints when attaching the lead frame to the optical sub-assembly.

In addition to the above, another advantage of this exemplary embodiment is that the lead frame connector can be manipulated into its operational configuration as part of the assembly process after the process used to dispose the conductors or leads within the casing, rather than during or as part of the process to dispose the conductors or leads within the casing.

The present invention may be embodied in other specific forms without departing from its spirit or essential characteristics. The described embodiments are to be considered in all respects only as illustrative and not restrictive.

I claim:

1. A lead frame connector for connecting an optoelectronic device to a printed circuit board, the lead frame connector comprising:
   an electrically insulating housing comprising a first casing having a body and at least one metal extension member extending from the body in a first direction; and
   a plurality of conductors electrically isolated one from another by the electrically insulating housing, each of the plurality of conductors comprising a first end disposed in the first casing, at least one of said plurality of conductors extending from the body in a second direction generally perpendicular to the first direction and comprising a pair of contacts mountable to the printed circuit board.

2. A lead frame connector as recited in claim 1, wherein the housing further comprises a second casing separated from the first casing, the second casing being movable relative to the first casing.

3. A lead frame connector as recited in claim 2, wherein at least one of the plurality of conductors extends from the first casing and extends through the second casing.

4. A lead frame connector as recited in claim 1, wherein the first casing comprises two extension members and at least one of the plurality of conductors extends from the first casing between the two extension members.

5. A lead frame connector as defined in claim 1, wherein each of the plurality of conductors includes a first contact, the first contact being connectable to a top surface of the printed circuit board.

6. A lead frame connector as defined in claim 5, wherein each of the plurality of contacts further includes a second contact having a hole configured to receive a corresponding lead of the optoelectronic device.

7. A lead frame connector as defined in claim 1, wherein at least one of the plurality of conductors are bent at segments thereof between the plurality of electrical contacts and the plurality of contact points.

8. A lead frame connector as recited in claim 3, wherein the at least one extension member extends from the first casing directly to the printed circuit board.

9. A lead frame connector as recited in claim 8, wherein the lead frame connector includes two extension members extending from opposing sides of the first casing.

10. A lead frame connector as recited in claim 1, wherein the at least one extension member passes through a portion of the printed circuit board to provide additional mechanical attachment.

11. A lead frame connector as recited in claim 1, wherein the at least one extension member increases the mechanical attachment of the lead frame connector to the printed circuit board but is not electrically connected to the optical subassembly and printed circuit board.

12. A lead frame connector as recited in claim 1, wherein the at least one extension member and the plurality of conductors are stamped from the same sheet of material during manufacture of the lead frame connector.

13. A transceiver module comprising:
a top portion mountable to a base portion;
an optical sub-assembly mountable in a cavity defined by the top and the base;
a printed circuit board mountable within the cavity; and
a lead frame connector as set forth in claim 1.

14. A lead frame connector for connecting an optoelectronic device to a printed circuit board, the lead frame connector comprising:
an electrically insulating housing;
a plurality of conductors electrically isolated one from another by the electrically insulating housing; and
at least one mechanical attachment member extending from the housing to the printed circuit board to provide mechanical attachment of the lead frame connector to the printed circuit board without carrying electrical signals, the at least one mechanical attachment member comprising at least one contact passable through a portion of the printed circuit board, wherein the at least one mechanical attachment member and the plurality of conductors are stamped from the same sheet of material during manufacture of the lead frame connector.

15. A lead frame connector as recited in claim 14, wherein the housing comprises a first casing and a second casing, the at least one mechanical attachment member extending from the first casing.

16. A lead frame connector as recited in claim 15, wherein at least one of the plurality of conductors extends from the first casing and through the second casing.

17. A lead frame connector as recited in claim 15, wherein the second casing is pivotal relative to the second casing.

18. A lead frame connector as recited in claim 14, wherein the at least one mechanical attachment member comprises a first end and a second end, the first end being disposed within the housing.

19. A lead frame connector as recited in claim 18, wherein the first end of the at least one mechanical attachment member has a cross-section greater than the cross-section of the second end.

20. The lead frame connector as recited in claim 14, wherein the housing comprises two extension members and at least one of the plurality of conductors extends from the housing between the two extension members.

* * * * *